United States Patent
Sakai et al.

(10) Patent No.: US 6,773,476 B2
(45) Date of Patent: Aug. 10, 2004

(54) POLISHING COMPOSITION AND POLISHING METHOD EMPLOYING IT

(75) Inventors: Kenji Sakai, Aichi (JP); Kazusei Tamai, Aichi (JP); Tadahiro Kitamura, Aichi (JP); Tsuyoshi Matsuda, Aichi (JP); Katsuyoshi Ina, Aichi (JP)

(73) Assignee: Fujimi Incorporated, Nishikasugai-gun (JP)

( * ) Notice: Subject to any disclaimer, the term of this patent is extended or adjusted under 35 U.S.C. 154(b) by 29 days.

(21) Appl. No.: 10/200,173

(22) Filed: Jul. 23, 2002

(65) Prior Publication Data

US 2003/0051413 A1 Mar. 20, 2003

(30) Foreign Application Priority Data

Jul. 23, 2001 (JP) .................................. 2001-220803
Apr. 30, 2002 (JP) .................................. 2002-128372

(51) Int. Cl.$^7$ ............................. C09G 1/02; C09G 1/04
(52) U.S. Cl. ............................. 51/307; 51/308; 51/309; 106/3; 438/692; 438/693; 216/105; 216/106
(58) Field of Search ........................ 51/307, 308, 309; 106/3; 438/692, 693; 216/105, 106

(56) References Cited

U.S. PATENT DOCUMENTS

| | | | |
|---|---|---|---|
| 5,391,258 A | 2/1995 | Brancaleoni et al. | |
| 5,428,721 A | 6/1995 | Sato et al. | |
| 5,476,606 A | 12/1995 | Brancaleoni et al. | |
| 5,575,885 A | 11/1996 | Hirabayashi et al. | |
| 5,770,095 A | 6/1998 | Sasaki et al. | |
| 5,858,813 A | 1/1999 | Scherber et al. | |
| 5,954,997 A | 9/1999 | Kaufman et al. | |
| 6,126,853 A | 10/2000 | Kaufman et al. | |
| 6,217,416 B1 | 4/2001 | Kaufman et al. | |
| 6,428,721 B1 | 8/2002 | Ina et al. | |
| 6,436,811 B1 * | 8/2002 | Wake et al. ................. | 438/633 |
| 6,440,186 B1 | 8/2002 | Sakai et al. | |
| 6,530,968 B2 * | 3/2003 | Tsuchiya et al. ............... | 51/307 |
| 6,551,935 B1 * | 4/2003 | Sinha et al. ................. | 438/693 |
| 2001/0005009 A1 | 6/2001 | Tsuchiya et al. | |
| 2003/0170991 A1 * | 9/2003 | Wang et al. ................. | 438/692 |

FOREIGN PATENT DOCUMENTS

EP       0 846 742        6/1998

* cited by examiner

*Primary Examiner*—Michael Marcheschi
(74) *Attorney, Agent, or Firm*—Oblon, Spivak, McClelland, Maier & Neustadt, P.C.

(57) ABSTRACT

A polishing composition comprising:

(a) at least one abrasive selected from the group consisting of silicon dioxide and aluminum oxide, (b) at least one organic compound selected from the group consisting of a polyethylene oxide, a polypropylene oxide, a polyoxyethylene alkyl ether, a polyoxypropylene alkyl ether, a polyoxyethylenepolyoxypropylene alkyl ether and a polyoxyalkylene addition polymer having a C≡C triple bond, represented by the formula (1):

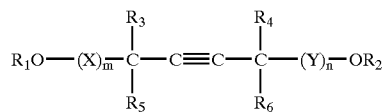

wherein each of $R_1$ to $R_6$ is H or a $C_{1-10}$ alkyl group, each of X and Y is an ethyleneoxy group or a propyleneoxy group, and each of m and n is a positive number of from 1 to 20, (c) at least one polishing accelerating compound selected from the group consisting of citric acid, oxalic acid, tartaric acid, glycine, α-alanine and histidine, (d) at least one anticorrosive selected from the group consisting of benzotriazole, benzimidazole, triazole, imidazole and tolyltriazole, (e) hydrogen peroxide, and (f) water.

20 Claims, 1 Drawing Sheet

Fig.1(a) Fig.1(b) Fig.1(c) Fig.1(d)

POLISHING COMPOSITION AND POLISHING METHOD EMPLOYING IT

The present invention relates to a polishing composition to be used for polishing substrates for semiconductors, photomasks and various memory hard disks, particularly for polishing for planarization of the surface of device wafers in e.g. semiconductor industry.

More particularly, the present invention relates to a polishing composition which is highly efficient, provides high selectivity and is applicable to formation of excellent polished surface in the polishing of semiconductor devices to which so-called chemical mechanical polishing technology is applied, in the processing of device wafers, and a polishing method employing such a composition.

Progress of computer products has been remarkable in recent years, and parts to be used for such products, such as ULSI devices, have been developed for high integration and high speed, year after year. Along with such progress, the design rule for semiconductor devices has been progressively refined year after year, the depth of focus in a process for producing devices tends to be shallow, and planarization required for the pattern-forming surface tends to be increasingly strict.

Further, to cope with an increase in resistance of the wiring due to refinement of the wiring on the device, it has been studied to employ copper instead of tungsten or aluminum, as the wiring material. By its nature, copper is hardly processable by anisotropic etching, and accordingly, it requires the following process.

Namely, after forming wiring grooves and vias on an insulating layer, copper wirings are formed by sputtering or plating (so-called damascene method), and then an unnecessary copper layer deposited on the insulating layer is removed by chemical mechanical polishing (hereinafter referred to as "CMP") which is a combination of mechanical polishing and chemical polishing.

However, in such a process, it may happen that copper atoms will diffuse into the insulating layer to deteriorate the device properties. Therefore, for the purpose of preventing diffusion of copper atoms, it has been studied to provide a barrier layer on the insulating layer having wiring grooves or vias formed. As a material for such a barrier layer, metal tantalum or a tantalum-containing compound such as tantalum nitride is most suitable from the viewpoint of the reliability of the device and is expected to be employed mostly in the future. In the present invention, "a tantalum-containing compound" includes not only a compound such as tantalum nitride but also metal tantalum, and "copper" includes not only copper but also a copper alloy with e.g. aluminum.

Accordingly, in such a CMP process for a semiconductor device containing such a copper layer and a tantalum-containing compound, firstly the copper layer as the outermost layer and then the tantalum-containing compound layer as the barrier layer, are polished, respectively, and polishing will be completed when it has reached the insulating layer of e.g. silicon dioxide or monofluoro silicon oxide. As an ideal process, it is desired that by using only one type of a polishing composition, the copper layer and the tantalum-containing compound layer are uniformly removed by polishing in a single polishing step, and polishing will be completed certainly when it has reached the insulating layer.

However, copper and a tantalum-containing compound are different in their hardness, chemical stability and other mechanical properties and accordingly in the processability, and thus, it is difficult to adopt such an ideal polishing process. Accordingly, the following two step polishing process, i.e. polishing process divided into two steps, is being studied.

Firstly, in the first step polishing (hereinafter referred to as the first step polishing), using a polishing composition capable of polishing a copper layer at a high efficiency, the copper layer is polished using e.g. a tantalum-containing compound layer as a stopper until such a tantalum-containing compound layer is reached. Here, for the purpose of not forming various surface damages such as recesses, erosion, dishing, etc., on the copper layer surface, the first step polishing may be terminated immediately before reaching the tantalum-containing compound layer i.e. while a copper layer still slightly remains. Then, in the second step polishing (hereinafter referred to as the second step polishing), using a polishing composition capable of polishing mainly a tantalum-containing compound layer at a high efficiency, the remaining thin copper layer and the tantalum-containing compound layer are polished using the insulating layer as a stopper, and polishing is completed when it has reached the insulating layer.

Here, recesses, erosion and dishing are surface damages due to excessive polishing of the wiring portion. The recesses are meant for dents in the wiring portion (copper in this case), and they are usually caused by a chemical etching action to the wiring portion. The erosion is meant for a phenomenon such that at an aligned copper wiring portion and an insulating portion, the insulating portion is excessively polished as compared with an insulating area portion (a non-aligned portion), and it is usually caused by elastic deformation of a pad, a high stock removal rate of the insulating layer, or an excessive pressure concentration to the insulating portion. The dishing is meant for a phenomenon such that at a copper wiring portion having a relatively wide width, the center portion of the wiring is recessed in a dish shape, and it is usually caused by deformation of a pad.

Along with miniaturization of devices, the cross sectional area of a wiring layer has become small, whereby the above-mentioned surface damages are likely to occur when devices are produced, and the area of the wiring portion will thereby be further reduced, whereby the resistance may increase, or in an extreme case, contact failure may result. Therefore, in the first step polishing, it is important not to permit surface damages to form on the wiring layer, which can not be removed by the second step polishing, while the stock removal rate against the copper layer should not be impaired.

As an example of the polishing composition to be used for such first step polishing, JP-A-7-233485 (prior art 1) discloses a polishing liquid for a copper type metal layer, which comprises at least one organic acid selected from the group consisting of aminoacetic acid (hereinafter referred to as glycine) and amidesulfuric acid, an oxidizing agent and water, and a method for producing a semiconductor device using such a polishing liquid. Further, JP-A-8-83780 discloses an abrasive which contains aminoacetic acid and/or amidesulfuric acid, an oxidizing agent, water and benzotriazole or its derivative, and a polishing method using such an abrasive. When a copper layer is polished by using such a polishing liquid (or an abrasive), a relatively high stock removal rate can be obtained.

However, as a result of the experiments conducted by the present inventors, it has been confirmed that when a wafer having a pattern including a copper wiring formed thereon, is polished by using a polishing liquid simply containing an abrasive, glycine and hydrogen peroxide, chemical etching effect on copper and erosion on the copper surface after the polishing tend to be significant, and formation of recesses on the copper wiring portion tends to be substantial. Further, in a case where benzotriazole having a function to suppress chemical etching effect on copper is incorporated in order to suppress erosion on the copper surface, if the addition amount of benzotriazole is too large, the stock removal rate of the copper layer tends to be significantly low, and the polishing takes long time, such being inefficient. On the other hand, if the addition amount of benzotriazole is too small, no adequate function to suppress chemical etching effect can be obtained, and it is thereby impossible to adequately suppress formation of recesses on the copper wiring portion.

Thus, according to the experiments conducted by the present inventors, it has been found impossible to provide an adequate stock removal rate of a copper layer and at the same time to sufficiently suppress formation of recesses on a copper wiring portion, when the copper wiring is polished by using a polishing composition comprising an abrasive, glycine, benzotriazole and water, as in the above prior art 1.

Here, with reference to FIG. 1, the phenomenon of formation of recesses will further be considered from a physicochemical viewpoint. FIG. 1(a) illustrates the state of a device when polishing has reached a barrier layer (tantalum-containing compound: Ta). FIGS. 1(b) and 1(c) are enlarged views of portion A in FIG. 1(a) to illustrate effects. FIG. 1(d) shows the state of the device after the polishing. As shown by FIGS. 1(a) to 1(d), it can be concluded that recesses are formed by two effects which will be described below.

Figure 1A:
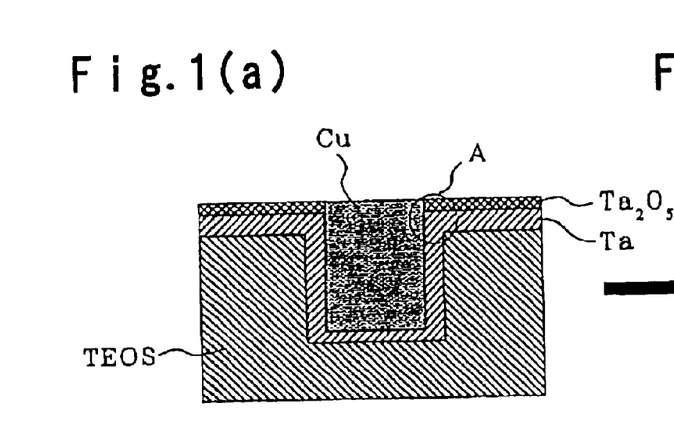
FIGS. 1(a) to 1(d) are schematic views illustrating the mechanism for the formation of recesses at a copper wiring portion of a device.
Figure 1B:
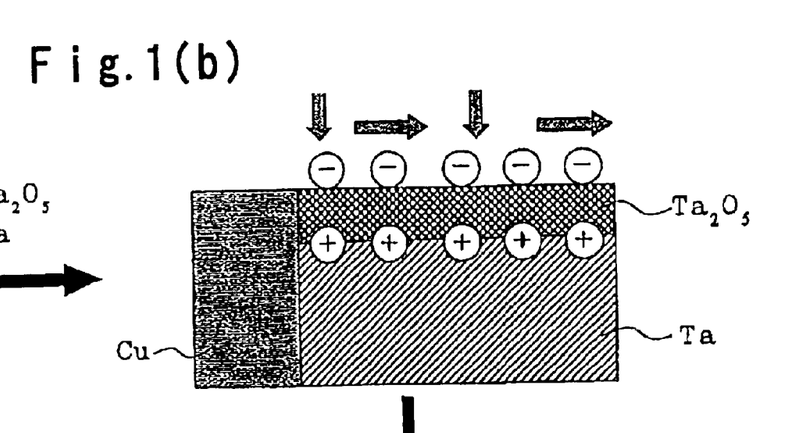
Figure 1C:
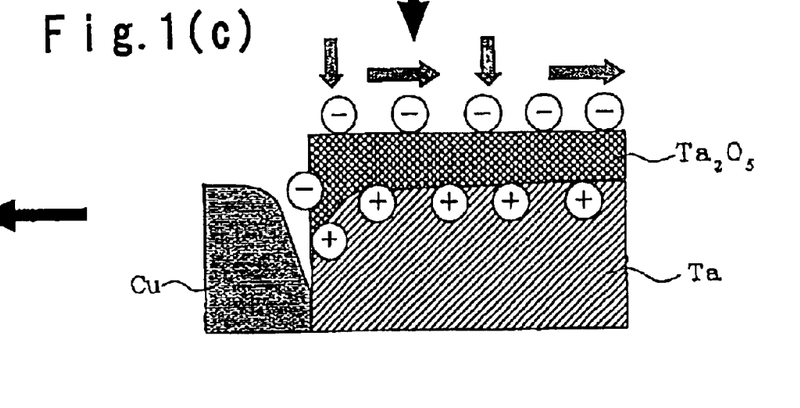
Figure 1D:
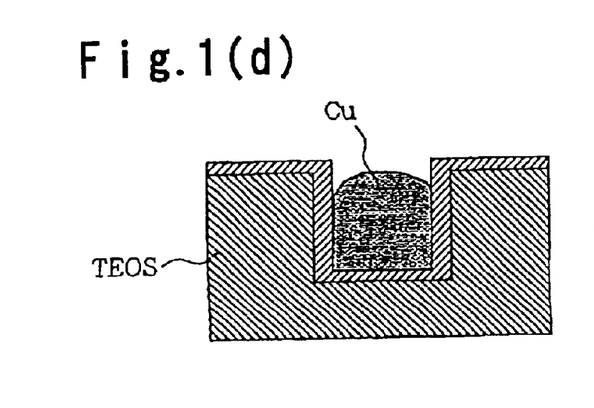

Namely, the first effect is an effect by a voltage formed by the frictional force and pressure during the polishing. As shown in FIGS. 1(a) and 1(b), the surface of the tantalum-containing compound is oxidized by the polishing composition and will readily be changed into tantalum oxide ($Ta_2O_5$). Tantalum oxide is a highly dielectric and piezoelectric substance, and thus, when a pressure is exerted to this tantalum oxide, a voltage will be formed. Accordingly, during the polishing, if a pressure and frictional force are exerted to the device surface, a voltage will be formed by a piezoelectric effect on the surface of the tantalum-containing compound changed to tantalum oxide (the surface layer side is negatively charged, and the Ta interface side is positively charged). The second effect is an effect by a so-called galvanic cell, which will be formed between copper and the tantalum-containing compound. This effect is caused by a difference in the specific electrochemical potential between copper (Cu) and the tantalum-containing compound. Copper is a base metal as compared with the tantalum-containing compound and is readily soluble in water. Accordingly, if a voltage is formed by the first effect, electrons are removed by the positively charged tantalum oxide, whereby copper tends to be readily ionized, and as shown in FIG. 1(c), copper is selectively subjected to chemical etching, whereby as shown in FIG. 1(d), deep recesses will be formed along the copper wiring portion after the polishing. At that time, the polishing composition serves as an electrolyte and thus promotes the chemical etching effect.

Accordingly, it is strongly desired to develop a polishing composition which has an adequate stock removal rate of a copper layer and with which polishing can be carried out without forming recesses on the copper wiring portion, i.e. while reducing chemical etching to copper, in polishing an object to be polished where copper and the tantalum-containing compound are coexistent.

The present invention has been made to solve the above-described problems, and it is an object of the present invention to provide a polishing composition, with which polishing can be carried out with a low chemical etching effect against copper, i.e. by suppressing formation of recesses on the copper wiring portion, without impairing the stock removal rate of a copper layer, in a CMP process for producing a semiconductor device comprising at least a layer made of copper and a layer made of a tantalum-containing compound on a substrate, and a polishing method employing such a polishing composition.

The polishing composition of the present invention comprises (a) at least one abrasive selected from the group consisting of silicon dioxide and aluminum oxide, (b) at least one organic compound selected from the group consisting of a polyethylene oxide, a polypropylene oxide, a polyoxyethylene alkyl ether, a polyoxypropylene alkyl ether, a polyoxyethylenepolyoxypropylene alkyl ether and a polyoxyalkylene addition polymer having a C≡C triple bond, represented by the formula (1):

wherein each of $R_1$ to $R_6$ is H or a $C_{1-10}$ alkyl group, each of X and Y is an ethyleneoxy group or a propyleneoxy group, and each of m and n is a positive number of from 1 to 20, (c) at least one polishing accelerating compound selected from the group consisting of citric acid, oxalic acid, tartaric acid, glycine, α-alanine and histidine, (d) at least one anticorrosive selected from the group consisting of benzotriazole, benzimidazole, triazole, imidazole and tolyltriazole, (e) hydrogen peroxide, and (f) water.

The polishing composition of the present invention is characterized in that the organic compound (b) comprises (b1) at least one organic compound selected from the group consisting of a polyethylene oxide, a polypropylene oxide and a polyoxyalkylene addition polymer having a C≡C triple bond, represented by the above formula (1), and (b2) at least one organic compound selected from the group consisting of a polyoxyethylene alkyl ether, a polyoxypropylene alkyl ether and a polyoxyethylenepolyoxypropylene alkyl ether.

The polishing composition of the present invention is also characterized in that the organic compound (b) comprises (b3) a polyoxyalkylene addition polymer having a C≡C triple bond, represented by the above formula (1), and (b2) at least one organic compound selected from the group consisting of a polyoxyethylene alkyl ether, a polyoxypropylene alkyl ether and a polyoxyethylenepolyoxypropylene alkyl ether.

The polishing composition of the present invention is characterized in that the polyoxyalkylene addition polymer having a C≡C triple bond, represented by the above formula (1), is a dialkyldimethylbutynediol polyoxyethylene glycol ether represented by the formula (2):

wherein each of $R_1$ and $R_2$ is a $C_{1-10}$ alkyl group, and each of m and n is a positive number of from 1 to 20.

The polishing method of the present invention comprises polishing a semiconductor device having at least a layer of copper and a layer of a tantalum-containing compound formed on a substrate, with the above polishing composition.

Now, the present invention will be described in further detail with reference to the preferred embodiments.

In the accompanying drawings.

Abrasive

The abrasive as one of components of the polishing composition of the present invention plays a role of mechanical polishing in the CMP process, and as such an abrasive, it is commonly known to employ fine particles of e.g. an oxide, a nitride or a carbide of a metal. In the present invention, at least one member selected from the group consisting of silicon dioxide and aluminum oxide, is used, and it is particularly preferred to employ silicon dioxide.

The silicon dioxide includes many types differing in the properties or in the processes for their production, including colloidal silica, fumed silica and others. In the present invention, one of them, or a mixture of a plurality of them may be employed. However, it is more preferred to employ colloidal silica.

The aluminum oxide includes α-alumina, γ-alumina, θ-alumina, κ-alumina and other morphologically different ones. Further, from its process, there is one called colloidal alumina or fumed alumina. In the present invention, one of them or a mixture of a plurality of them may be employed. However, it is preferred to employ colloidal alumina or fumed alumina which can be dispersed in a stable colloidal state in water.

Further, the abrasive is one which polishes the surface to be polished, by a mechanical action as abrasive grains, and the particle size is influential over the stock removal rate or the quality of the polished surface. Namely, with a view to maintaining a sufficient stock removal rate and suppressing formation of defects on the device surface after the polishing, the preferred particle size is from 10 to 100 nm, more preferably from 20 to 80 nm, still further preferably from 30 to 60 nm, as an average particle size obtained from the surface area measured by a BET method.

The concentration of the abrasive in the polishing composition is preferably from 0.5 to 200 g/l, more preferably from 5 to 100 g/l. If the concentration of the abrasive is too low, the mechanical polishing power tends to decrease, whereby the stock removal rate of the copper layer may decrease in some cases. On the other hand, if the concentration of the abrasive is too high, the mechanical polishing power tends to increase, whereby the rate of polishing the tantalum-containing compound layer tends to be too high, and erosion is likely to result.

Organic Compound

The organic compound as one of components of the polishing composition of the present invention is at least one member selected from the group consisting of a polyethylene oxide, a polypropylene oxide, a polyoxyethylene alkyl ether, a polyoxypropylene alkyl ether, a polyoxyethylenepolyoxypropylene alkyl ether and a polyoxyalkylene addition polymer having a C≡C triple bond, represented by the formula (1):

wherein each of $R_1$ to $R_6$ is H or a $C_{1-10}$ alkyl group, each of X and Y is an ethyleneoxy group or a propyleneoxy group, and each of m and n is a positive number of from 1 to 20.

The polyethylene oxide is usually called polyethylene glycol and has the following structural formula.

wherein n is an integer representing mols of added ethylene glycol.

The polypropylene oxide is usually called polypropylene glycol and has the following structural formula.

wherein m is an integer representing mols of added polypropylene oxide.

The molecular weights of the polyethylene oxide and the polypropylene oxide are not particularly limited, but they are preferably compounds having an average molecular weight of from 100 to 10,000, more preferably from 200 to 1,000.

The polyethylene oxide and the polypropylene oxide play a role of suppressing recesses on the copper wiring portion in polishing of a device. In order to have the role performed sufficiently, the amount of their addition is preferably from 1 to 200 g/l, more preferably from 10 to 100 g/l, based on the entire composition. If the amount is too small, no adequate effect for suppressing recesses can be expected. On the other hand, if the amount is too large, the polishing accelerating effects of the abrasive or the polishing accelerating compound tend to be prevented, and the stock removal rate may likely be decreased.

The polyoxyethylene alkyl ether has the following structural formula and is one having ethylene oxide addition-polymerized to a linear or branched higher alcohol.

wherein R is an alkyl group, and n is an integer representing mols of added ethylene glycol.

The polyoxypropylene alkyl ether has the following structural formula and is one having propylene oxide addition-polymerized to a linear or branched higher alcohol.

wherein R is an alkyl group, and m is an integer representing mols of added propylene glycol.

The polyoxyethylenepolyoxypropylene alkyl ether has the following structural formula and is one having propylene oxide and ethylene oxide addition-polymerized to a linear or branched higher alcohol.

wherein R is an alkyl group, and m is an integer representing mols of added propylene glycol, and n is an integer representing mols of added ethylene glycol.

The polyoxyalkylene addition polymer having a C≡C triple bond, represented by the formula (1), is preferably a dialkyldimethylbutynediol polyoxyethylene glycol ether represented by the formula (2):

wherein each of $R_1$ and $R_2$ is a $C_{1-10}$ alkyl group, and each of m and n is a positive number of from 1 to 20.

The molecular weights of the polyoxyethylene alkyl ether, the polyoxypropylene alkyl ether, the polyoxyethylenepolyoxypropylene alkyl ether and the polyoxyalkylene addition polymer having a C≡C triple bond, represented by the formula (1), are not particularly limited. However, they are preferably compounds having an average molecular weight of from 1,000 to 30,000, more preferably from 2,000 to 20,000. From the fact that no effects can be obtained if only hydrophilic groups or hydrophobic groups are present in the molecule, it is evident that the balance of mols of the added hydrophilic groups (ethylene oxide) and the hydrophobic groups (alkyl) is important. Namely, the amount of the added hydrophilic groups in the molecule is preferably from 10 to 80%. Further, the polyoxyethylene alkyl ether, the polyoxypropylene alkyl ether and the polyoxyethylenepolyoxypropylene alkyl ether may have an optional alkyl group within a range not to impair the effects of the present invention.

The polyoxyethylene alkyl ether, the polyoxypropylene alkyl ether and the polyoxyethylenepolyoxypropylene alkyl ether, play a role is of suppressing recesses on the copper wiring portion in polishing of a device. In order to have the role performed sufficiently, the amount of their addition is preferably from 1 to 50 g/l, more preferably from 2 to 30 g/l, based on the entire composition. Further, the amount of the polyoxyalkylene addition polymer having a C≡C triple bond, represented by the formula (1), is preferably from 0.5 to 100 g/l, more preferably from 1 to 50 g/l, based on the entire composition. If the amount is too small, no adequate effect for suppressing recesses can be expected. On the other hand, if the amount is excessive, the polishing accelerating effect of the abrasive or the polishing accelerating compound is likely to be prevented, and the stock removal rate may likely be decreased.

Each of the polyethylene oxide, the polypropylene oxide, the polyoxyethylene alkyl ether, the polyoxypropylene alkyl ether, the polyoxyethylenepolyoxypropylene alkyl ether and the polyoxyalkylene addition polymer having a C≡C triple bond, represented by the formula (1), is a nonionic type organic compound and is not one which increases the electrical conductivity of the polishing composition. Accordingly, it is considered that even if such an organic compound is incorporated to the polishing composition, the electrical conductivity of the polishing composition can be maintained to be low, and the polishing composition tends to hardly act as an electrolyte during polishing. Specifically, the electrical conductivity is preferably at most 100 μm·cm.

The polyethylene oxide, the polypropylene oxide, the polyoxyethylene alkyl ether, the polyoxypropylene alkyl ether, the polyoxyethylenepolyoxypropylene alkyl ether and the polyoxyalkylene addition polymer having a C≡C triple bond, represented by the formula (1), are required to be dissolved or suspended in the composition. A plurality of the above organic compounds may be used in combination within a range not to impair the effects of the present invention, and they may be combined in optional proportions.

Further, copolymers of such polyoxyethylene alkyl ether, polyoxypropylene alkyl ether and polyoxyethylenepolyoxypropylene alkyl ether, i.e. a polyoxyethylene copolymer, a polyoxypropylene copolymer and a polyoxyethylenepolyoxypropylene copolymer, are expected to have similar effects.

Polishing Accelerating Compound

The polishing accelerating compound as one of components of the polishing composition of the present invention is at least one member selected from the group consisting of citric acid, oxalic acid, tartaric acid, glycine, α-alanine and histidine. Here, "the polishing accelerating compound" is meant for a compound whereby copper can be more readily dissolved when this polishing accelerating compound is contained in a solution having hydrogen peroxide dissolved in pure water, and such a compound serves to chelate copper thereby to accelerate polishing of the copper layer. Among them, glycine is more preferred.

The amount of such polishing accelerating compound is preferably from 2 to 20 g/l, more preferably from 5 to 15 g/l, based on the entire composition. If the amount is less than 2 g/l, the stock removal rate of the copper layer tends to be small, such being undesirable. On the other hand, if the amount exceeds 20 g/l, the stock removal rate of the copper layer tends to be too high, whereby the polishing control tends to be difficult. Accordingly, a due care is required at the time of using it.

Anticorrosive

The anticorrosive as one of components of the polishing composition of the present invention, is at least one member selected from the group consisting of benzotriazole, benzimidazole, triazole, imidazole and tolyltriazole. Here, the anticorrosive is one having a function to protect the copper surface during and after polishing and to suppress erosion of the copper surface. Among them, benzotriazole is more preferred.

The amount of such anticorrosive is preferably from 0.01 to 0.2 g/l, more preferably from 0.02 to 0.1 g/l, based on the entire composition. If the amount is less than 0.01 g/l, the copper surface after polishing tends to be readily corroded, such being undesirable. On the other hand, if the amount exceeds 0.2 g/l, the effect for forming a protective layer for copper tends to be strong, whereby non-uniformity in polishing is likely to be induced, and the stock removal rate of copper is likely to deteriorate, such being undesirable.

Hydrogen Peroxide

The hydrogen peroxide as one of components of the polishing composition of the present invention, serves as an oxidizing agent. And, the hydrogen peroxide has an adequate oxidizing power to oxidize copper and has a characteristic such that one containing no metal ion as an impurity can readily be available. Accordingly, it is particularly suitable for the polishing composition of the present invention.

The amount of hydrogen peroxide in the polishing composition is preferably from 2 to 40 g/l, more preferably from 5 to 20 g/l, based on the entire composition. If the amount of hydrogen peroxide is too small or too large, the stock removal rate of the copper layer may likely be small.

Water

The water as one of components of the polishing composition of the present invention is preferably one having impurities reduced as far as possible, so that the above-mentioned respective components can precisely perform their roles. Namely, it is preferably distilled water, or one having impurity ions removed by an ion exchange resin and having suspended matters removed by a filter.

Polishing Composition

The polishing composition of the present invention is prepared by dissolving or dispersing the above-described respective components i.e. at least one abrasive selected from the group consisting of silicon dioxide and aluminum oxide, at least one organic compound selected from the group consisting of a polyethylene oxide, a polypropylene oxide, a polyoxyethylene alkyl ether, a polyoxypropylene alkyl ether, a polyoxyethylenepolyoxypropylene alkyl ether and a C≡C triple bond, represented by the formula (1):

wherein each of $R_1$ to $R_6$ is H or a $C_{1-10}$ alkyl group, each of X and Y is an ethyleneoxy group or a propyleneoxy group, and each of m and n is a positive number of from 1 to 20, at least one polishing accelerating compound selected from the group consisting of citric acid, oxalic acid, tartaric acid, glycine, α-alanine and histidine, at least one anticorrosive selected from the group consisting of benzotriazole, benzimidazole, triazole, imidazole and tolyltriazole, and hydrogen peroxide, in water. Further, in some cases, an etching-suppressing agent may be added and mixed.

The method and order for dissolving or dispersing the respective components are optional. For example, stirring by a vane-type stirrer or supersonic dispersion may be employed. By such a method, the components other than the abrasive will be dissolved, and the abrasive will be dispersed in water, whereby the composition will be a uniform dispersion.

Further, at the time of preparing the above polishing composition, a basic compound, a various surfactant and others may suitably be mixed for the purpose of maintaining the quality of the product or for providing safety or depending upon the type of the object to be polished, the polishing conditions and other necessity for polishing.

The pH of the polishing composition of the present invention is not particularly limited, but it is preferred that the composition is adjusted to have pH 3 to pH 10. Various basic compounds may be mentioned as an agent to increase the pH. Specifically, ammonia, ethylene diamine, tetramethylammonium hydroxide, tetraethylammonium hydroxide, potassium hydroxide, sodium hydroxide, piperidine, piperazine and ethanol amine may, for example, be mentioned. Among them, those which have a small etching action to copper and which hardly agglomerate abrasive grains, are preferred, and those containing no other metals as impurities, are preferred. From such viewpoints, tetramethylammonium hydroxide is preferred. On the other hand, as a pH-controlling agent to be used to lower the pH, the above-mentioned citric acid, oxalic acid, tartaric acid and an etching-suppressing agent may have such effects. As other examples, inorganic acids such as hydrochloric acid, nitric acid, sulfuric acid, carbonic acid, phosphoric acid and chloroacetic acid, may, for example, be mentioned.

The polishing composition of the present invention may have an etching-suppressing agent incorporated to suppress a static chemical etching action to copper. Here, "static" means a chemical etching action when the object is exposed to the polishing composition without receiving any mechanical action before or after polishing. The etching-suppressing agent is meant for a compound having at least one carboxyl group in a back bone of a saturated hydrocarbon or a hydrocarbon having one or two unsaturated bonds. Further, among such compounds, one having a carbon number of at least 10, is preferred. Further, preferred is one having a solubility in water of at most 0.2 g/100 g.

Specifically, lauric acid, linoleic acid, myristic acid, palmitic acid, stearic acid, oleic acid, sebacic acid and dodecanoic diacid may, for example, be mentioned. More preferred is one having one carboxyl group, and from this viewpoint, lauric acid, linolic acid, myristic acid, palmitic acid, stearic acid or oleic acid is preferred, and lauric acid or linoleic acid is more preferred.

The amount of the etching-suppressing agent in the polishing composition is usually from 0.01 to 1 g/l, preferably from 0.02 to 0.1 g/l, based on the entire composition. If the amount of the etching-suppressing agent is less than 0.01 g/l, such is not sufficient to suppress the chemical etching action to copper. On the other hand, if the amount of the etching-suppressing agent exceeds 1 g/l, it tends to suppress the stock removal rate of the copper layer excessively, and its dissolution in the polishing composition tends to be difficult.

In the polishing composition of the present invention, the surfactant may further be used to increase the dispensability of the abrasive or to adjust the viscosity or the surface tension of the polishing composition. The surfactants include, for example, a dispersing agent, a wetting agent, a thickener, a defoaming agent, a foaming agent, a water repellent, etc. The surfactant to be used as a dispersing agent, may usually be of a sulfonic acid type, a phosphoric acid type, a carboxylic acid type or a nonionic type.

The polishing composition of the present invention may be prepared, stored or transported in the form of a stock solution having a relatively high concentration, so that it may be diluted for use at the time of actual polishing operation. The above-mentioned preferred range for the concentration is one for the actual polishing operation. Needless to say, in the case of adopting such a method of use, the stock solution during the storage or transportation is a solution having a higher concentration.

Further, hydrogen peroxide has a characteristic such that it decomposes in the presence of e.g. metal ions or ammonium ions. Accordingly, it is advisable to add and mix it to the polishing composition immediately prior to the actual use for polishing operation. Such decomposition of hydrogen peroxide can be suppressed by at least one organic compound selected from the group consisting of a polyethylene oxide, a polypropylene oxide, a polyoxyethylene alkyl ether, a polyoxypropylene alkyl ether, a polyoxyethylenepolyoxypropylene alkyl ether and a polyoxyalkylene addition polymer having a C≡C triple bond, represented by the formula (1) to some extent, but it can be suppressed also by mixing another alcohol or carboxylic acid. Further, it is possible to obtain such an effect by the above-mentioned pH-adjusting agent. However, such decomposition will be influenced also by the storage environment, and there is a possibility that part of hydrogen peroxide undergoes decomposition due to a temperature change during transportation or due to formation of a stress. Accordingly, it is preferred to mix hydrogen peroxide immediately before the polishing.

Polishing Method

The polishing method of the present invention comprises polishing a semiconductor device having at least a layer of copper and a layer of a tantalum-containing compound formed on a substrate, with the polishing composition comprising the above-described respective components i.e. at least one abrasive selected from the group consisting of silicon dioxide and aluminum oxide, at least one organic compound selected from the group consisting of a polyethylene oxide, a polypropylene oxide, a polyoxyethylene alkyl ether, a polyoxypropylene alkyl ether, a polyoxyethylenepolyoxypropylene alkyl ether and a polyoxyalkylene addition polymer having a C≡C triple bond, represented by the formula (1), at least one polishing accelerating compound selected from the group consisting of citric acid, oxalic acid, tartaric acid, glycine, α-alanine and histidine, at least one anticorrosive selected from the group consisting of benzotriazole, benzimidazole, triazole, imidazole and tolyltriazole, hydrogen peroxide, and water, and, in some cases, an etching-suppressing agent.

By this polishing method, polishing can be carried out with a low chemical etching action to copper i.e. while suppressing formation of recesses on the copper wiring portion, without impairing the stock removal rate of the copper layer.

The reason for such a low chemical etching action to the copper layer i.e. suppression of formation of recesses, is considered to be as follows.

Namely, it has been made possible to suppress formation of recesses on the copper wiring portion by incorporating at least one organic compound selected from the group consisting of a polyethylene oxide, a polypropylene oxide, a polyoxyethylene alkyl ether, a polyoxypropylene alkyl ether, a polyoxyethylenepolyoxypropylene alkyl ether and a polyoxyalkylene addition polymer having a C≡C triple bond, represented by the formula (1), to the polishing composition. By the incorporation of such an organic compound, the polishing composition of the present invention suppresses the role as an electrolyte which accelerates dissolution of copper by the above-described two effects on the copper wiring portion (see FIGS. 1(a) to 1(d)), and further, the anticorrosive effects are promoted by the anticorrosive incorporated to form a protective layer on the surface of the copper layer. Further, it is considered that the incorporation of an etching-preventing agent serves to suppress a static chemical etching action, and even when the object to be polished is exposed to the polishing composition before or after the polishing, the chemical etching action can be suppressed.

Further, the roles which the respective components other than the above will play in the polishing of copper, are considered to be as follows. Firstly, the abrasive serves to perform so-called mechanical polishing and accelerates polishing. Hydrogen peroxide oxidizes the copper surface to form a brittle oxidized layer. Further, the polishing accelerating compound affects the oxidized copper surface to form a chelate with copper ions. Here, polishing of copper proceeds by a combined effect of the chemical effect on copper of hydrogen peroxide and the polishing accelerating compound and the mechanical effect of the abrasive. Further, the anticorrosive suppresses erosion of the copper surface after the polishing, and further suppresses an excessive chemical etching action to copper. It is considered that by these effects, formation of recesses on the copper wiring portion can be suppressed, and a high stock removal rate of copper can be realized.

When a wafer having a device pattern containing copper and a tantalum-containing compound formed thereon, is polished by using the polishing composition of the present invention i.e. the one comprising at least one abrasive selected from the group consisting of silicon dioxide and aluminum oxide, at least one organic compound selected from the group consisting of a polyethylene oxide, a polypropylene oxide, a polyoxyethylene alkyl ether, a polyoxypropylene alkyl ether, a polyoxyethylenepolyoxypropylene alkyl ether and a polyoxyalkylene addition polymer having a C≡C triple bond, represented by the formula (1), at least one polishing accelerating compound selected from the group consisting of citric acid, oxalic acid, tartaric acid, glycine, α-alanine and histidine, at least one anticorrosive selected from the group consisting of benzotriazole, benzimidazole, triazole, imidazole and tolyltriazole, hydrogen peroxide, and water, in the above-mentioned preferred ranges of concentrations or amounts, it is possible to accomplish a stock removal rate of the copper layer being at least 5,000 Å/min, and a depth of recesses on a copper wiring portion having a wiring width of 10 μm being not more than 600 Å in a state where only the copper layer is removed.

Now, the practical embodiments of the present invention will be described in detail with reference to Examples. However, it should be understood that the present invention is by no means restricted to such specific Examples.

EXAMPLES 1 to 57 and COMPARATIVE EXAMPLES 1 to 8

Preparation and Contents of Polishing Compositions

Colloidal silica having an average particle size of 40 nm as the abrasive, glycine as the polishing accelerating compound, benzotriazole as the anticorrosive, hydrogen peroxide, and various types as identified in Table 1, as the organic compound, were mixed to water so that they will be blended in the proportions as identified in Table 1, to prepare the respective polishing compositions of Examples 1 to 57 and Comparative Examples 1 to 8.

In Examples 1 to 17, an ethylene glycol, a polyethylene oxide, a polypropylene oxide, a polyoxyethylene alkyl ether, a polyoxypropylene alkyl ether or a polyoxyethylenepolyoxypropylene alkyl ether was used as the organic compound, and its molecular weight and amount were changed, and the amounts of other components i.e. colloidal silica, glycine, benzotriazole and hydrogen peroxide were the same, respectively.

In Examples 18 to 53, a polyethylene oxide (molecular weight: 400) or a polyoxyethylenepolyoxypropylene alkyl ether (molecular weight: 8,000) was used as the organic compound. In Examples 18 to 23 among them, the amount of the organic compound was varied, and in Examples 24 to 29, the amount of the polyethylene oxide was changed. Further, in Examples 30 to 35, the concentration of the colloidal silica was changed, and in Examples 36 to 41, the amount of glycine was changed. Further, in Examples 42 to 47, the amount of benzotriazole was changed, and in Examples 48 to 53, the amount of hydrogen peroxide was changed, and each of other components was the same.

Further, in Example 54, a polyethylene oxide (molecular weight: 400) and a polyoxyethylenepolyoxypropylene alkyl ether (molecular weight: 9,000) were added as two types of the organic compound, and the amounts of other components were the same as in Example 1. Further, in Example 55, the amounts of the abrasive and other components in Example 1 were increased, and in Example 56 and Example 57, lauric acid and linoleic acid were, respectively, added as the etching-suppressing agent to the same composition as in Example 1.

In Comparative Example 1, no organic compound was incorporated. In Comparative Examples 2, 5 and 8, no abrasive was incorporated, and in Comparative Examples 5 and 8 among them, potassium polyacrylate (molecular weight: 5,000) and polyvinyl alcohol (molecular weight: 5,000) were, respectively, used as the organic compound. Further, in Comparative Examples 3, 4, 6 and 7, ammonium polyacrylate (molecular weight: 5,000), potassium polyacrylate (molecular weight: 5,000), polyvinyl alcohol (molecular weight: 20,000) and polyvinyl alcohol (molecular weight: 5,000) were, respectively, used as the organic compound.

As the hydrogen peroxide solution, a commercially available 31% aqueous solution was used, and it was mixed immediately prior to the polishing. However, the amount of hydrogen peroxide in Table 1 is the real amount in the composition.

TABLE 1

| No. | Organic compound Type | Organic compound g/l | Colloidal silica g/l | Glycine g/l | BTA g/l | Hydrogen peroxide g/l | Other g/l | Stock removal rate of copper Å/min | Recesses Å |
|---|---|---|---|---|---|---|---|---|---|
| Ex. 1 | PEG M400 | 50 | 30 | 9 | 0.05 | 10 | | 6,000 | 400 |
| Ex. 2 | PPG M800 | 50 | 30 | 9 | 0.05 | 10 | | 5,700 | 370 |
| Ex. 3 | POPAE M3000 | 10 | 30 | 9 | 0.05 | 10 | | 5,500 | 330 |
| Ex. 4 | POPAE M5000 | 10 | 30 | 9 | 0.05 | 10 | | 5,400 | 330 |
| Ex. 5 | POEPOPAE M10000 | 10 | 30 | 9 | 0.05 | 10 | | 5,200 | 330 |
| Ex. 6 | EG | 50 | 30 | 9 | 0.05 | 10 | | 6,200 | 470 |
| Ex. 7 | PEG M100 | 50 | 30 | 9 | 0.05 | 10 | | 6,000 | 430 |
| Ex. 8 | PEG M200 | 50 | 30 | 9 | 0.05 | 10 | | 5,900 | 430 |
| Ex. 9 | PEG M1000 | 50 | 30 | 9 | 0.05 | 10 | | 5,800 | 430 |
| Ex. 10 | PEG M10000 | 50 | 30 | 9 | 0.05 | 10 | | 5,500 | 500 |
| Ex. 11 | PEG M20000 | 50 | 30 | 9 | 0.05 | 10 | | 4,000 | 600 |
| Ex. 12 | POEPOPAE M800 | 10 | 30 | 9 | 0.05 | 10 | | 5,100 | 300 |
| Ex. 13 | POEPOPAE M1000 | 10 | 30 | 9 | 0.05 | 10 | | 5,800 | 330 |
| Ex. 14 | POEPOPAE M2000 | 10 | 30 | 9 | 0.05 | 10 | | 6,000 | 330 |
| Ex. 15 | POEPOPAE M20000 | 10 | 30 | 9 | 0.05 | 10 | | 5,500 | 400 |
| Ex. 16 | POEPOPAE M30000 | 10 | 30 | 9 | 0.05 | 10 | | 5,100 | 400 |
| Ex. 17 | POEPOPAE M40000 | 10 | 30 | 9 | 0.05 | 10 | | 3,900 | 330 |
| Ex. 18 | POEPOPAE M8000 | 0.5 | 30 | 9 | 0.05 | 10 | | 6,300 | 650 |
| Ex. 19 | POEPOPAE M8000 | 1 | 30 | 9 | 0.05 | 10 | | 6,100 | 550 |
| Ex. 20 | POEPOPAE M8000 | 2 | 30 | 9 | 0.05 | 10 | | 5,500 | 500 |
| Ex. 21 | POEPOPAE M8000 | 30 | 30 | 9 | 0.05 | 10 | | 5,000 | 400 |
| Ex. 22 | POEPOPAE M8000 | 50 | 30 | 9 | 0.05 | 10 | | 4,500 | 330 |
| Ex. 23 | POEPOPAE M8000 | 100 | 30 | 9 | 0.05 | 10 | | 2,900 | 300 |
| Ex. 24 | PEG M400 | 0.5 | 30 | 9 | 0.05 | 10 | | 6,500 | 670 |
| Ex. 25 | PEG M400 | 1 | 30 | 9 | 0.05 | 10 | | 6,400 | 600 |
| Ex. 26 | PEG M400 | 10 | 30 | 9 | 0.05 | 10 | | 6,200 | 500 |
| Ex. 27 | PEG M400 | 100 | 30 | 9 | 0.05 | 10 | | 5,600 | 470 |
| Ex. 28 | PEG M400 | 200 | 30 | 9 | 0.05 | 10 | | 5,000 | 430 |
| Ex. 29 | PEG M400 | 300 | 30 | 9 | 0.05 | 10 | | 4,500 | 400 |
| Ex. 30 | PEG M400 | 50 | 0.3 | 9 | 0.05 | 10 | | 2,500 | 270 |
| Ex. 31 | PEG M400 | 50 | 0.5 | 9 | 0.05 | 10 | | 5,000 | 400 |
| Ex. 32 | PEG M400 | 50 | 5 | 9 | 0.05 | 10 | | 5,500 | 430 |
| Ex. 33 | PEG M400 | 50 | 100 | 9 | 0.05 | 10 | | 6,500 | 500 |
| Ex. 34 | PEG M400 | 50 | 200 | 9 | 0.05 | 10 | | 7,200 | 600 |
| Ex. 35 | PEG M400 | 50 | 250 | 9 | 0.05 | 10 | | 7,500 | 830 |
| Ex. 36 | PEG M400 | 50 | 30 | 1 | 0.05 | 10 | | 900 | 100 |
| Ex. 37 | PEG M400 | 50 | 30 | 2 | 0.05 | 10 | | 2,900 | 270 |
| Ex. 38 | PEG M400 | 50 | 30 | 5 | 0.05 | 10 | | 4,800 | 430 |
| Ex. 39 | PEG M400 | 50 | 30 | 15 | 0.05 | 10 | | 7,200 | 600 |
| Ex. 40 | PEG M400 | 50 | 30 | 20 | 0.05 | 10 | | 7,800 | 670 |
| Ex. 41 | PEG M400 | 50 | 30 | 30 | 0.05 | 10 | | 8,500 | 930 |
| Ex. 42 | PEG M400 | 50 | 30 | 9 | 0.005 | 10 | | 7,000 | 830 |
| Ex. 43 | PEG M400 | 50 | 30 | 9 | 0.01 | 10 | | 6,500 | 600 |
| Ex. 44 | PEG M400 | 50 | 30 | 9 | 0.02 | 10 | | 6,100 | 500 |
| Ex. 45 | PEG M400 | 50 | 30 | 9 | 0.1 | 10 | | 5,200 | 500 |
| Ex. 46 | PEG M400 | 50 | 30 | 9 | 0.2 | 10 | | 4,100 | 500 |
| Ex. 47 | PEG M400 | 50 | 30 | 9 | 0.3 | 10 | | 3,000 | 500 |
| Ex. 48 | PEG M400 | 50 | 30 | 9 | 0.05 | 1 | | 2,900 | 400 |
| Ex. 49 | PEG M400 | 50 | 30 | 9 | 0.05 | 2 | | 4,000 | 430 |
| Ex. 50 | PEG M400 | 50 | 30 | 9 | 0.05 | 5 | | 4,500 | 470 |
| Ex. 51 | PEG M400 | 50 | 30 | 9 | 0.05 | 20 | | 5,100 | 500 |
| Ex. 52 | PEG M400 | 50 | 30 | 9 | 0.05 | 40 | | 4,400 | 470 |
| Ex. 53 | PEG M400 | 50 | 30 | 9 | 0.05 | 50 | | 4,000 | 430 |
| Ex. 54 | PEG M400 + POEPOPAE M2000 | 50 + 10 | 30 | 9 | 0.05 | 10 | | 5,100 | 330 |
| *Ex. 55 | PEG M400 | 200 | 100 | 45 | 0.25 | 50 | | 5,500 | 400 |
| Ex. 56 | PEG M400 | 50 | 30 | 9 | 0.05 | 10 | La 0.05 g/l | 4,300 | 530 |
| Ex. 57 | PEG M400 | 50 | 30 | 9 | 0.05 | 10 | Ln 0.05 g/l | 4,000 | 570 |
| Comp. Ex. 1 | None | | 50 | 30 | 9 | 0.05 | 10 | 6,500 | 1,000 |
| Comp. Ex. 2 | PEG M400 | 50 | None | 1 | 0.05 | 10 | | 1,100 | 400 |
| Comp. Ex. 3 | Pa-NH₄ M5000 | 50 | 30 | 9 | 0.05 | 10 | | 7,000 | 850 |
| Comp. Ex. 4 | Pa-K M5000 | 50 | 30 | 9 | 0.05 | 10 | | 6,500 | 800 |
| Comp. Ex. 5 | Pa-K M5000 | 50 | None | 9 | 0.05 | 10 | | 2,500 | 900 |
| Comp. Ex. 6 | PVA M20000 | 5 | 30 | 9 | 0.05 | 10 | | 4,500 | 650 |

TABLE 1-continued

| | Organic compound | | Colloidal silica | Glycine | BTA | Hydrogen peroxide | Other | Stock removal rate of copper | Recesses |
|---|---|---|---|---|---|---|---|---|---|
| No. | Type | g/l | g/l | g/l | g/l | g/l | g/l | Å/min | Å |
| Comp. Ex. 7 | PVA M5000 | 10 | 30 | 9 | 0.05 | 10 | | 6,200 | 750 |
| Comp. Ex. 8 | PVA M5000 | 10 | None | 9 | 0.005 | 10 | | 2,200 | 900 |

*Note: In actual polishing, the composition was diluted 5 times with water (4 parts of water was added to 1 part of the polishing composition).

In Table 1, EG represents ethylene glycol, PEG polyethylene oxide, PPG polypropylene oxide, POEAE polyoxyethylene alkyl ether, POPAE polyoxypropylene alkyl ether, POEPOPAE polyoxyethylenepolyoxypropylene alkyl ether, Pa-$NH_4$ ammonium polyacrylate, Pa-K potassium polyacrylate, and PVA polyvinyl alcohol. Further, each molecular weight is represented in such a manner that, for example, a molecular weight of 1,000 is represented by M1000. Further, BTA represents benzotriazole, La lauric acid, and Ln linoleic acid.

Polishing Tests

Using the respective polishing compositions of Examples 1 to 57 and Comparative Examples 1 to 8, polishing was carried out under the following conditions against the film-formed surface of the object to be polished. However, in Example 55, one having the composition diluted 5 times with pure water (the polishing composition:pure water=1:4) was employed.

Polishing Conditions

Polishing machine: single-side polishing machine for CMP (Mirra, manufactured by Applied materials Company)

Object to be polished: copper blanket wafer (8 inch silicon wafer having a copper layer formed by electrolytic plating) copper pattern wafer (854 mask pattern, manufactured by SEMATECH Company)

Polishing pad: laminated polishing pad made of polyurethane (IC-1000/Suba40O), manufactured by Rodel Inc., USA)

Polishing pressure: 2 psi (about 13.8 kPa)

Table rotational speed: 80 rpm

Feed rate of the polishing composition: 200 cc/min

Carrier rotational speed: 80 rpm

Evaluation of the stock removal rate was carried out by means of a copper blanket wafer. Polishing was carried out for one minute, and the layer thickness before and after the polishing of the object to be polished, was measured by means of a sheet resistance meter (VR-120, manufactured by Kokusai Denki System Service K.K.) and the layer thickness difference was calculated, and from the calculated value, the stock removal rate was obtained.

Further, evaluation of recesses on the copper wiring was carried out by means of a copper pattern wafer. Polishing was carried out until copper at the area portion was completely polished and removed, and the difference in height between the copper wiring portion and the barrier layer after the polishing was measured by means of a profiler (HRP340, manufactured by KLA Tencole Company) which is a contact type surface measuring apparatus to determine the depth of the recesses of the copper wiring portion of 10 μm of the object to be polished, after the polishing.

The results of the stock removal rate and the depth of the recesses are shown in Table 1.

It is evident from Table 1 that in Examples 1 to 11 in which one of ethylene glycol, a polyethylene oxide, a polypropylene oxide, a polyoxyethylene alkyl ether, a polyoxypropylene alkyl ether and a polyoxyethylenepolyoxypropylene alkyl ether, is used as an organic compound, and its molecular weight is changed, an adequate stock removal rate of copper is obtainable, and formation of recesses on the copper wiring portion is small. However, if the molecular weight of such an organic compound increases beyond the preferred range, the stock removal rate of copper tends to be small. Further, also in Examples 12 to 53 in which the concentration of colloidal silica and the amounts of the organic compound, glycine, benzotriazole and hydrogen peroxide were changed, good results were obtained with respect to each of the stock removal rate of copper and formation of recesses. Further, also in Example 54 wherein a plurality of organic compounds were used, in Example 55 wherein a composition of a high concentration was prepared and diluted immediately before the polishing and in Examples 56 and 57 wherein lauric acid or linoleic acid was added as the etching-suppressing agent, good results were similarly obtained.

Whereas, in Comparative Example 1 wherein no organic compound was incorporated, it is evident that deep recesses were formed on the copper wiring portion. Further, in Comparative Examples 2, 5 and 8 wherein no abrasive was incorporated, there was a problem that the stock removal rate of copper was low, since no adequate mechanical polishing by an abrasive was carried out. Further, in Comparative Examples 3 to 5, a polyacrylate was incorporated as the organic compound, and in Comparative Examples 6 to 8, a polyvinyl alcohol was incorporated as the organic compound, but in each of these cases, deep recesses were formed on the copper wiring portion, and it is evident that the organic compound like a polyacrylate and a polyvinyl alcohol are not capable of suppressing formation of recesses.

EXAMPLES 61 to 101 and COMPARATIVE EXAMPLES 9 and 10

Preparation and Contents of Polishing Compositions

Colloidal silica having an average particle size of 40 nm as the abrasive, glycine as the polishing accelerating compound, benzotriazole as the anticorrosive, hydrogen peroxide and various types as identified in Table 2, as the organic compound (organic compound 1 and organic compound 2), were mixed to water, so that they were blended in the proportions as identified in Table 2, to prepare the respective polishing compositions of Examples 61 to 101 and Comparative Examples 9 and 10.

In Examples 61 to 73, two types of organic compounds i.e. organic compound 1 being diisobutyldimethylbutynediol polyoxyethylene glycol ether represented by the chemical formula (3):

and organic compound 2 being a polyoxyethylenepolyoxypropylene alkyl ether (molecular weight: 8,000), were used, and their amounts were changed, and the amounts of other components i.e. colloidal silica, glycine, benzotriazole and hydrogen peroxide, were the same, respectively.

In Examples 74 to 97, the organic compounds in the same amounts as in Example 64 were employed. In Examples 74 to 79 among them, the concentration of colloidal silica was changed, and in Examples 80 to 85, the amount of glycine was changed. Further, in Examples 86 to 91, the amount of benzotriazole was changed, and in Examples 92 to 97, the amount of hydrogen peroxide was changed, and the amount of each of other components was the same.

Further, in Example 98, two types of organic compounds i.e. organic compound 1 being diisobutyldimethylbutynediol polyoxyethylene glycol ether represented by the chemical formula (4):

and organic compound 2 being a polyoxyethylenepolyoxypropylene alkyl ether (molecular weight: 8,000), were used, and their amounts and the amounts of other components were the same as in Example 64. Further, in Example 99, among the organic compounds in Example 98, only organic compound 1 was employed, and in Example 100, organic compound 2 among the organic compounds in Example 64 was changed to polyoxyethylenepolyoxypropylene alkyl ether (molecular weight: 4,000), and in Example 101, the amounts of the organic compounds in Example 64, the abrasive and other components, were increased (the amounts of the respective components in Example 64 were increased by twice as much).

In Comparative Example 9, the abrasive and organic compound 2 among the organic compounds were not incorporated, and in Comparative Example 10, no abrasive was incorporated.

Further, as the hydrogen peroxide solution, a commercially available 31% aqueous solution was used, and it was mixed immediately before the polishing. However, the amount of hydrogen peroxide in Table 2 is a real amount in the composition.

TABLE 2

| No. | Organic compound 1 Type | Organic compound 1 g/l | Organic compound 2 Type | Organic compound 2 g/l | Colloidal silica g/l | Glycine g/l | BTA g/l | Hydrogen peroxide g/l | Stock removal rate of copper Å/min | Recesses Å |
|---|---|---|---|---|---|---|---|---|---|---|
| Ex. 61 | B | 0.5 | C | 2 | 20 | 9 | 0.06 | 10 | 6,500 | 600 |
| Ex. 62 | B | 1 | C | 2 | 20 | 9 | 0.06 | 10 | 6,300 | 500 |
| Ex. 63 | B | 2 | C | 2 | 20 | 9 | 0.06 | 10 | 6,200 | 450 |
| Ex. 64 | B | 5 | C | 2 | 20 | 9 | 0.06 | 10 | 6,000 | 400 |
| Ex. 65 | B | 30 | C | 2 | 20 | 9 | 0.06 | 10 | 4,800 | 380 |
| Ex. 66 | B | 50 | C | 2 | 20 | 9 | 0.06 | 10 | 4,100 | 360 |
| Ex. 67 | B | 100 | C | 2 | 20 | 9 | 0.06 | 10 | 3,000 | 350 |
| Ex. 68 | B | 5 | — | 0 | 20 | 9 | 0.06 | 10 | 6,500 | 650 |
| Ex. 69 | B | 5 | C | 0.5 | 20 | 9 | 0.06 | 10 | 6,300 | 550 |
| Ex. 70 | B | 5 | C | 1 | 20 | 9 | 0.06 | 10 | 6,200 | 450 |
| Ex. 71 | B | 5 | C | 10 | 20 | 9 | 0.06 | 10 | 5,100 | 380 |
| Ex. 72 | B | 5 | C | 30 | 20 | 9 | 0.06 | 10 | 3,800 | 360 |
| Ex. 73 | B | 5 | C | 50 | 20 | 9 | 0.06 | 10 | 2,500 | 350 |
| Ex. 74 | B | 5 | C | 2 | 0.3 | 9 | 0.06 | 10 | 2,500 | 400 |
| Ex. 75 | B | 5 | C | 2 | 0.5 | 9 | 0.06 | 10 | 4,000 | 400 |
| Ex. 76 | B | 5 | C | 2 | 5 | 9 | 0.06 | 10 | 5,500 | 400 |
| Ex. 77 | B | 5 | C | 2 | 100 | 9 | 0.06 | 10 | 6,500 | 500 |
| Ex. 78 | B | 5 | C | 2 | 200 | 9 | 0.06 | 10 | 7,200 | 630 |
| Ex. 79 | B | 5 | C | 2 | 250 | 9 | 0.06 | 10 | 7,500 | 700 |
| Ex. 80 | B | 5 | C | 2 | 20 | 1 | 0.06 | 10 | 900 | 300 |
| Ex. 81 | B | 5 | C | 2 | 20 | 2 | 0.06 | 10 | 2,000 | 310 |
| Ex. 82 | B | 5 | C | 2 | 20 | 5 | 0.06 | 10 | 4,500 | 350 |
| Ex. 83 | B | 5 | C | 2 | 20 | 15 | 0.06 | 10 | 6,500 | 490 |
| Ex. 84 | B | 5 | C | 2 | 20 | 20 | 0.06 | 10 | 6,700 | 570 |
| Ex. 85 | B | 5 | C | 2 | 20 | 30 | 0.06 | 10 | 7,000 | 700 |
| Ex. 86 | B | 5 | C | 2 | 20 | 9 | 0.005 | 10 | 8,500 | 800 |
| Ex. 87 | B | 5 | C | 2 | 20 | 9 | 0.01 | 10 | 7,000 | 650 |
| Ex. 88 | B | 5 | C | 2 | 20 | 9 | 0.02 | 10 | 6,500 | 500 |
| Ex. 89 | B | 5 | C | 2 | 20 | 9 | 0.1 | 10 | 5,000 | 370 |
| Ex. 90 | B | 5 | C | 2 | 20 | 9 | 0.2 | 10 | 3,500 | 360 |
| Ex. 91 | B | 5 | C | 2 | 20 | 9 | 0.3 | 10 | 2,500 | 350 |
| Ex. 92 | B | 5 | C | 2 | 20 | 9 | 0.06 | 1 | 1,800 | 350 |
| Ex. 93 | B | 5 | C | 2 | 20 | 9 | 0.06 | 2 | 2,500 | 360 |
| Ex. 94 | B | 5 | C | 2 | 20 | 9 | 0.06 | 5 | 4,500 | 380 |
| Ex. 95 | B | 5 | C | 2 | 20 | 9 | 0.06 | 20 | 5,500 | 430 |
| Ex. 96 | B | 5 | C | 2 | 20 | 9 | 0.06 | 40 | 4,500 | 480 |

TABLE 2-continued

| No. | Organic compound 1 Type | g/l | Organic compound 2 Type | g/l | Colloidal silica g/l | Glycine g/l | BTA g/l | Hydrogen peroxide g/l | Stock removal rate of copper Å/min | Recesses Å |
|---|---|---|---|---|---|---|---|---|---|---|
| Ex. 97 | B | 5 | C | 2 | 20 | 9 | 0.06 | 50 | 4,000 | 500 |
| Ex. 98 | A | 5 | C | 2 | 20 | 9 | 0.06 | 10 | 6,100 | 450 |
| Ex. 99 | A | 5 | — | 0 | 20 | 9 | 0.06 | 10 | 7,200 | 680 |
| Ex. 100 | B | 5 | D | 2 | 20 | 9 | 0.06 | 10 | 6,300 | 450 |
| *Ex. 101 | B | 10 | C | 4 | 40 | 18 | 0.08 | 20 | 5,900 | 400 |
| Comp. Ex. 9 | B | 5 | — | 0 | 0 | 9 | 0.06 | 10 | 900 | 1,200 |
| Comp. Ex. 10 | B | 5 | C | 2 | 0 | 9 | 0.06 | 10 | 800 | 800 |

*Note: In actual polishing, the composition was diluted twice with water (1 part of water was added to 1 part of the polishing composition).

In Table 2, A represents diisobutyldimethylbutynediol polyoxyethylene glycol ether represented by the chemical formula (3) and B represents diisobutyldimethylbutynediol polyoxyethylene glycol ether represented by the chemical formula (4). Further, C represents a polyoxyethylenepolyoxypropylene alkyl ether (molecular weight: 8,000), and D represents a polyoxyethylenepolyoxypropylene alkyl ether (molecular weight: 4,000).

Polishing Tests

Then, using the respective polishing compositions of Examples 61 to 100 and Comparative Examples 9 and 10, polishing was carried out under the same conditions as in the above-described Example 1, etc. against the film-formed side of the object to be polished. However, in Example 101, one having the composition diluted twice with pure water (polishing composition:pure water=1:1) was employed.

Further, the evaluation of the stock removal rate, and the evaluation of recesses on the copper wiring were carried out in the same manner as in the above-described Example 1, etc., and the results of the stock removal rate and formation of recesses, are shown in Table 2.

It is evident from Table 2 that when the diisobutyldimethylbutynediol polyoxyethylene glycol ether represented by the chemical formula (4) of B in Table 2 and the polyoxyethylenepolyoxypropylene alkyl ether of C, were used as the organic compounds, an adequate stock removal rate of copper was obtained, and formation of recesses of the copper wiring portion was small. Further, in Examples 61 to 97 wherein the concentration of colloidal silica and the amounts of the organic compounds (organic compounds 1 and 2), glycine, benzotriazole and hydrogen peroxide, were changed, good results were obtained also with respect to each of the stock removal rate of copper and formation of recesses. Further, also in Examples 68 and 93 to 100, in which the types of the organic compounds were changed, or the diisobutyldimethylbutynediol polyoxyethylene glycol ether of A represented by the chemical formula (3) in Table 2 or B represented by the chemical formula (4) was used, is and in Example 101 wherein a composition having a high concentration was prepared and diluted immediately before the polishing, good results were similarly obtained.

Whereas, in Comparative Examples 9 and 10 wherein no abrasive was incorporated, although the organic compounds were incorporated, it is evident that there was a problem such that the stock removal rate of copper was low, since no adequate mechanical polishing by the abrasive was carried out. Further, it is evident that in a case where no organic compound was incorporated as in Comparative Example in Table 2, deep recesses were formed on the copper wiring portion.

As described in the foregoing, the polishing composition of the present invention comprises (a) at least one abrasive selected from the group consisting of silicon dioxide and aluminum oxide, (b) at least one organic compound selected from the group consisting of a polyethylene oxide, a polypropylene oxide, a polyoxyethylene alkyl ether, a polyoxypropylene alkyl ether, a polyoxyethylenepolyoxypropylene alkyl ether and a polyoxyalkylene addition polymer having a C≡C triple bond, represented by the formula (1):

wherein each of $R_1$ to $R_6$ is H or a $C_{1\text{-}10}$ alkyl group, each of X and Y is an ethyleneoxy group or a propyleneoxy group, and each of m and n is a positive number of from 1 to 20, (c) at least one polishing accelerating compound selected from the group consisting of citric acid, oxalic acid, tartaric acid, glycine, a-alanine and histidine, (d) at least one anticorrosive selected from the group consisting of benzotriazole, benzimidazole, triazole, imidazole and tolyltriazole, (e) hydrogen peroxide, and (f) water.

It is thereby possible to obtain a polishing composition whereby polishing can be carried out in a low chemical etching action to copper i.e. while suppressing formation of recesses at the copper wiring portion, without impairing the stock removal rate of the copper layer, in the CMP process in the production of a semiconductor device containing at least a layer of copper and a layer of a tantalum-containing compound on a substrate.

In the polishing composition of the present invention, the organic compound (b) preferably comprises (b1) at least one organic compound selected from the group consisting of a polyethylene oxide, a polypropylene oxide and a polyoxyalkylene addition polymer having a C≡C triple bond, represented by the formula (1), and (b2) at least one organic compound selected from the group consisting of a polyoxyethylene alkyl ether, a polyoxypropylene alkyl ether and a polyoxyethylenepolyoxypropylene alkyl ether, whereby the above described effects can further be increased by such two or more organic compounds.

In the polishing composition of the present invention, the organic compound (b) preferably comprises (b3) a polyoxyalkylene addition polymer having a C≡C triple bond, represented by the above formula (1), and (b2) at least one organic compound selected from the group consisting of a polyoxyethylene alkyl ether, a polyoxypropylene alkyl ether and a polyoxyethylenepolyoxypropylene alkyl ether, whereby an organic compound having a higher effect can be included, and the above-mentioned effect can further be increased.

In the polishing composition of the present invention, the polyoxyalkylene addition polymer having a C≡C triple bond, represented by the formula (1) is preferably a dialkyldimethylbutynediol polyoxyethylene glycol ether represented by the formula (2):

wherein each of $R_1$ and $R_2$ is a $C_{1\text{-}10}$ alkyl group, and each of m and n is a positive number of from 1 to 20, whereby the above-described effects can be obtained.

Further, the polishing method of the present invention is a method which comprises polishing a semiconductor device having at least a layer of copper and a layer of a tantalum-containing compound formed on a substrate, with the above-described polishing composition, whereby polishing can be carried out without impairing the stock removal rate of the copper layer, while suppressing formation of recesses on the copper wiring portion, since the polishing composition contains at least one organic compound selected from the group consisting of an ethylene glycol, a polyethylene oxide, a polypropylene oxide, a polyoxyethylene alkyl ether, a polyoxypropylene alkyl ether, a polyoxyethylenepolyoxypropylene alkyl ether and a polyoxyalkylene addition polymer having a C≡C triple bond, represented by the formula (1).

The entire disclosures of Japanese Patent Application No. 2001-220803 filed on Jul. 23, 2001 and Japanese Patent Application No. 2002-128372 filed on Apr. 30, 2002 including specification, claims, drawings and summary are incorporated herein by reference in its entirety.

What is claimed is:

1. A polishing composition comprising:

(a) at least one abrasive selected from the group consisting of silicon dioxide and aluminum oxide, (b) a polyoxyalkylene addition polymer having a C≡C triple bond, represented by the formula (1):

wherein each of $R_1$ to $R_6$ is a $C_{1\text{-}10}$ alkyl group, each of X and Y is an ethylene group or a propylene group and each of m and n is a positive number of from 1 to 20, and optionally at least one organic compound selected from the group consisting of a polyethylene oxide, a polypropylene oxide, a polyoxyethylene alkyl ether, a polyoxypropylene alkyl ether, and a polyoxyethylenepolyoxypropylene alkyl ether, (c) at least one polishing accelerating compound selected from the group consisting of citric acid, oxalic acid, tartaric acid, glycine, α-alanine and histidine,

(d) at least one anticorrosive selected from the group consisting of bertzotriazole, benzimidazole, triazole, imidazole and tolyltriazole, (e) hydrogen peroxide, and (f) water.

2. The polishing composition according to claim 1, wherein the organic compound (b) comprises (b1) said polyoxyalkylene addition polymer having a C≡C triple bond represented by said formula (1), and optionally at least one organic compound selected from the group consisting of a polyethylene oxide, and a polypropylene oxide, and (b2) at least one organic compound selected from the group consisting of a polyoxyethylene alkyl ether, a polyoxypropylene alkyl ether and a polyoxyethylenepolyoxypropylene alkyl ether.

3. The polishing composition according to claim 1, wherein the polyoxyalkylene addition polymer having a C≡C triple bond, represented by the above formula (1), is a dialkyldimethylbutynediol polyoxyethylene glycol ether represented by the formula (2):

wherein each of $R_1$ and $R_2$ is a $C_{1\text{-}10}$ alkyl group, and each of m and n is a positive number of from 1 to 20.

4. A polishing method which comprises polishing a semiconductor device having at least a layer of copper and a layer of a tantalum-containing compound formed on a substrate, with the polishing composition as defined in claim 1.

5. The polishing composition according to claim 1, wherein component (a) is at least silicon dioxide.

6. The polishing composition according to claim 5, wherein the silicon dioxide is colloidal silica.

7. The polishing composition according to claim 1, wherein component (a) is present in an amount of 0.5 to 200 g/l of the polishing composition.

8. The polishing composition according to claim 7, wherein said amount is 5 to 100 g/l of the polishing composition.

9. The polishing composition according to claim 1, wherein the amount of the polyoxyalkylene addition polymer having a C≡C triple bond, represented by said formula (1) is from 0.5 to 100 g/l of the polishing composition.

10. The polishing composition according to claim 9, wherein said amount is from 1 to 50 g/l of the polishing composition.

11. The polishing composition according to claim 1, wherein component (c) is at least glycine.

12. The polishing composition according to claim 1, wherein component (c) is present in an amount of 2 to 20 g/l of the polishing composition.

13. The polishing composition according to claim 12, wherein said amount is from 5 to 15 g/l of the polishing composition.

14. The polishing composition according to claim 1, wherein component (d) is at least benzotriazole.

15. The polishing composition according to claim 1, wherein component (d) is present in an amount of 0.01 to 0.2 g/l of the polishing composition.

16. The polishing composition according to claim 15, wherein said amount is 0.02 to 0.1 g/l of the polishing composition.

17. The polishing composition according to claim 1, wherein component (e) is present in an amount of 2 to 40 g/l of the polishing composition.

18. The polishing composition according to claim 17, wherein said amount is from 5 to 20 g/l of the polishing composition.

19. The polishing composition according to claim 1, wherein the polishing composition additionally comprises at least one etching/suppressing agent.

20. The polishing composition according to claim 19, wherein at least one etching/suppressing agent is present in an amount of 0.01 to 1 g/l of the polishing composition.

* * * * *